US010389346B1

United States Patent
Kirchner et al.

(10) Patent No.: US 10,389,346 B1
(45) Date of Patent: Aug. 20, 2019

(54) SOURCE/SINK UNIT CHARGE/DISCHARGE CIRCUIT WITH FAST SWITCHING DEVICES

(71) Applicant: Infineon Technologies Austria AG, Villach (AT)

(72) Inventors: Uwe Kirchner, St. Michael i. Lav. (AT); Stefano De Filippis, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/011,148

(22) Filed: Jun. 18, 2018

(51) Int. Cl.
*H03K 17/0412* (2006.01)
*H03K 17/0814* (2006.01)

(52) U.S. Cl.
CPC . *H03K 17/04123* (2013.01); *H03K 17/04126* (2013.01); *H03K 17/08142* (2013.01); *H03K 17/08146* (2013.01)

(58) Field of Classification Search
CPC ....... H03K 17/04123; H03K 17/04126; H03K 17/08142; H03K 17/08146
See application file for complete search history.

(56) References Cited

U.S. PATENT DOCUMENTS 6,008,630 A * 12/1999 Prasad .................... H02M 1/34
323/222

OTHER PUBLICATIONS

U.S. Appl. No. 16/272,802, by Infineon Technologies Austria AG (Inventors: Uwe Kirchner et al.), filed Feb. 11, 2019.

* cited by examiner

*Primary Examiner* — Daniel C Puentes
(74) *Attorney, Agent, or Firm* — Shumaker & Sieffert, P.A.

(57) ABSTRACT

A circuit may include a switching element configured to draw a positive current from a source/sink unit when the switching element is turned on, the source/sink unit including an inductance, the inductance emitting an excess positive current after the switching element is turned off. Additionally, the circuit may include a snubber circuit configured to absorb the excess positive current from the inductance of the source/sink unit, and deliver a negative current to the source/sink unit. In one example, the delivered negative current has a lower amperage and a longer duration than the positive current.

20 Claims, 4 Drawing Sheets

SOURCE/SINK UNIT CHARGE/DISCHARGE CIRCUIT WITH FAST SWITCHING DEVICES

TECHNICAL FIELD

This disclosure relates to circuit electronics including switching elements.

BACKGROUND

Switching elements may regulate the flow of current in a circuit. For instance, a switching element may conduct electricity while the switching element is 'on,' and the switching element may prevent current from passing while the switching element is 'off.' A resistance value of the switching element may be high while the switching element is 'off,' and the resistance value of the switching element may be low while the switching element is 'on.' However, a rapid change in the resistance value of a switching element may concurrently provoke a rapid change in voltage across the switching element. Snubber units including resistive elements and capacitive elements may be configured to decrease a magnitude of the rapid change in voltage across a switching element after the switching element turns off. In some cases, a circuit including switching elements and snubber units may induce directional current through a source/sink unit.

SUMMARY

In general, this disclosure is directed to techniques for a circuit including fast switching elements which may induce directional current through a source/sink unit. For example, a circuit may include at least one switching element and at least one snubber unit. The at least one switching element may induce a positive current between a first terminal and a second terminal of the source/sink unit. In some examples, the at least one snubber unit may deliver a negative current to the source/sink unit, wherein the negative current is traveling in the opposite direction of the positive current relative to the source/sink unit. The source/sink unit may define an internal resistance and an internal inductance. In one example, the negative current may recharge the source/sink unit.

In one example, a circuit includes a switching element configured to draw a positive current from a source/sink unit when the switching element is turned on, the source/sink unit including an inductance, the inductance emitting an excess positive current after the switching element is turned off. The circuit further includes a snubber circuit configured to absorb the excess positive current from the inductance of the source/sink unit, and deliver a negative current to the source/sink unit, wherein the delivered negative current has a lower amperage and a longer duration than the positive current.

In another example, a system includes a source/sink unit including an inductance, a control circuit, and a charge/discharge unit. The charge/discharge unit includes a switching element configured to draw a positive current from the source/sink unit when the switching element is turned on, the inductance of the source/sink unit emitting an excess positive current after the switching element is turned off, and a snubber circuit configured to absorb the excess positive current from the inductance of the source/sink unit, and deliver a negative current to the source/sink unit, wherein the delivered negative current has a lower amperage and a longer duration than the positive current, and wherein the control circuit is configured to send control signals to the switching element, the control signals turning on the switching element and turning off the switching element.

In another example, a method includes drawing a positive current by a first switching element configured from a source/sink unit when the first switching element is turned on, the source/sink unit including an inductance, the inductance emitting an excess positive current after the first switching element is turned off absorbing the excess positive current from the inductance of the source/sink unit, and delivering a negative current to the source/sink unit, wherein the negative current has a lower amperage and a longer duration than the positive current.

The details of one or more examples are set forth in the accompanying drawings and the description below. Other features, objects, and advantages will be apparent from the description and drawings, and from the claims.

DETAILED DESCRIPTION

A circuit may include at least one switching element configured to turn on and off during the operation of the circuit. The circuit may be configured to draw a current from a source/sink unit. Some parameters associated with the circuit may include an amount of time in which the at least one switching element is turned on, and an amount of current drawn from the source/sink unit by the circuit. First, a control circuit may regulate the amount of time in which the at least one switching element of the circuit is turned on, and accurate signals may be required from the control circuit to reliably regulate the at least one switching element. Second, the amount of current drawn from the source/sink unit may depend on the amount of time that the at least one switching element is turned on, and the control circuit may alter the amount of time that the at least one switching element is turned on to regulate the amount of current drawn from the source/sink unit.

The source/sink unit may also supply power to a load, such as one or more electric motors. The load may be separate from the circuit including at least one switching element. In some examples, the load may draw a large current from the source/sink unit while the load is connected to the source/sink unit.

In order to charge and discharge the source/sink unit, a control circuit may turn on a first switching element of the circuit, connecting a first terminal and a second terminal of the source/sink unit. Subsequently, a positive current may pass from the first terminal to the second terminal of the source/sink unit via the first switching element. After a period of time, the control circuit may turn off the first switching element, and a snubber circuit may be configured to absorb an excess positive current dissipated by an internal inductance of the source/sink unit. The snubber circuit may deliver a negative current to the source/sink unit, wherein the negative current is traveling in the opposite direction as the positive current relative to the source/sink unit, and wherein the negative current may recharge the source/sink unit.

Figure 1:
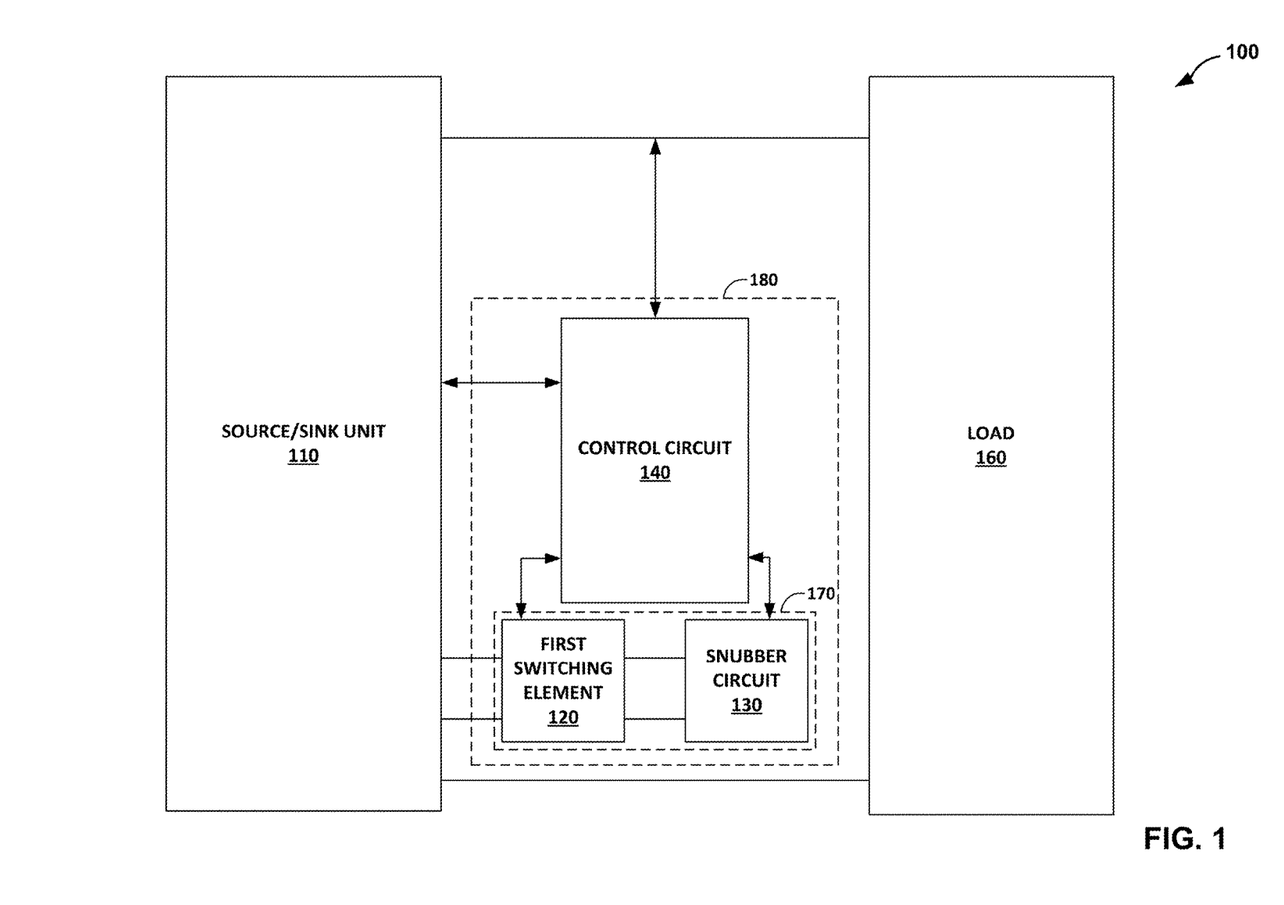
FIG. 1 is a block diagram illustrating an exemplary system for charging and discharging a source/sink unit, in accordance with one or more techniques of this disclosure.

FIG. 1 is a block diagram illustrating an exemplary system 100 for charging and discharging a source/sink unit, in accordance with one or more techniques of this disclosure. As illustrated in the example of FIG. 1, system 100 may include source/sink unit 110, first switching element 120, snubber circuit 130, control circuit 140, load 160, source/sink unit charge/discharge circuit 170, and circuit 180.

In one example, source/sink unit 110 may include a plurality of lithium-ion cells arranged in series. In other examples, source/sink unit 110 may include lead-acid, nickel metal hydride, or other materials. Source/sink unit 110 may define an internal resistance and an internal inductance. Internal circuit elements are not themselves separate physical components. Rather, the internal resistance and the internal inductance of source/sink unit 110 are inherent properties of source/sink unit 110 (sometimes referred to as parasitic resistance and parasitic inductance), which are inseparable from the structure of source/sink unit 110 itself. Furthermore, source/sink unit 110 may define a voltage value, and source/sink unit 110 may be configured to supply power to a circuit. When connected to a circuit, source/sink unit 110 may release a current from a first terminal of source/sink unit 110. For example, first switching element 120 may complete a circuit between a first terminal and a second terminal of source/sink unit 110 when first switching element 120 is turned on, causing a positive current to flow from the first terminal to the second terminal via first switching element 120. In one example, the voltage value of source/sink unit 110 is approximately 400V. In other examples, the voltage value of source/sink unit 110 may comprise other values.

First switching element 120 may comprise a power switch such as, but not limited to, any type of field-effect transistor (FET) including a metal-oxide-semiconductor field-effect transistor (MOSFET), a bipolar junction transistor (BJT), an insulated-gate bipolar transistor (IGBT), a junction field effect transistor (JFET), or another element that uses voltage for its control. First switching element 120 may include an n-type transistor, a p-type transistor, and a power transistor, or any combination thereof. In some examples, first switching element 120 may include vertical transistors, lateral transistors, and/or horizontal transistors. In some examples, first switching element 120 may include other analog devices such as diodes and/or thyristors. In some examples, the first switching element 120 may operate as a switch and/or as an analog device.

First switching element 120 may include three terminals: two load terminals and a control terminal. For MOSFET switches, first switching element 120 may include a drain terminal, a source terminal, and at least one gate terminal, where the control terminal is a gate terminal. For BJT switches, the control terminal may comprise a base terminal. Current may flow between the two load terminals of first switching element 120, based on the voltage at the control terminal. Therefore, electrical current may flow across first switching element 120 based on control signals delivered to the control terminal of first switching element 120 by control circuit 140. In one example, a voltage value of 10V must be applied to the control terminal of first switching element 120 in order to turn first switching element 120 'on,' allowing first switching element 120 to draw a positive current from source/sink unit 110 and conduct electricity. In other examples, other voltage values may be required to activate first switching element 120. Furthermore, first switching element 120 may be turned 'off' when the voltage applied to the control terminal of first switching element 120 is decreased. The resistance of first switching element 120 and the voltage across first switching element 120 may be increased when first switching element 120 is turned off. In one example, first switching element 120 may be adversely affected if the voltage across the load terminals of first switching element 120 exceeds a voltage threshold.

First switching element 120 may include various material compounds, such as silicon (Si), silicon carbide (SiC), Gallium Nitride (GaN), or any other combination of one or more semiconductor materials. In some examples, silicon carbide switches may experience lower switching power losses. Improvements in magnetics and faster switching, such as Gallium Nitride switches, may allow first switching element 120 to draw short bursts of current from source/sink unit 110. These higher frequency switching elements may require control signals to be sent with more precise timing, as compared to lower-frequency switching elements.

In one example, snubber circuit 130 may comprise circuit elements including resistors, capacitors, inductors, diodes, semiconductor switches, and other semiconductor elements. In the example illustrated in FIG. 1, snubber circuit 130 may absorb an excess positive current from the internal inductance of source/sink unit 110, after first switching element 120 is deactivated. For example, first switching element 120 may turn off when the voltage applied to the control terminal of first switching element 120 decreases, thus increasing the resistance of switching element 120. In this example, snubber circuit 130 may absorb at least some of an excess positive current emitted by source/sink unit 110, and the voltage across the load terminals of first switching element 120 may not exceed the voltage threshold in which first switching element 120 is adversely affected.

Moreover, snubber circuit 130 may be configured to deliver a negative current to source/sink unit 110. In one example, a second switching element (not pictured in FIG. 1) of snubber circuit 130 may turn on, causing snubber circuit 130 to release the negative current. The negative current delivered to source/sink unit 110 by snubber circuit 130 may recharge source/sink unit 110.

In some examples, the positive current emitted by source/sink unit 110 and the negative current delivered by snubber circuit 130 may cross source/sink unit 110. Source/sink unit 110 may define an internal resistance, wherein the internal resistance is an inherent property of source/sink unit 110. Therefore, the internal resistance is inseparable from the structure of source/sink unit 110, and the internal resistance may influence the operation of a circuit when source/sink unit 110 is used in the circuit. The internal resistance of source/sink unit 110 may include an internal resistance value. Consequently, the internal resistance of source/sink unit 110 functions as a conventional resistor would function in an electrical circuit. When the positive current and the negative current cross source/sink unit 110, by extension, the positive current and the negative current cross the internal resistance of source/sink unit 110. As current crosses a resistor, the resistor may release energy. This phenomenon is known as the Joule effect.

Control circuit 140 may include any one or more of a microprocessor, a controller, a digital signal processor (DSP), an application specific integrated circuit (ASIC), a field-programmable gate array (FPGA), discrete logic circuitry, or any other processing circuitry configured to provide the functions attributed to control circuit 140 herein. Control circuit 140 may be embodied as firmware, hardware, software or any combination thereof. In one example, control circuit 140 is configured to deliver control signals to the control terminal of first switching element 120 to control the flow of electricity between the load terminals of first switching element. In some examples, control circuit 140 is also configured to deliver control signals to the control terminal of a switching element 130. Control circuit 140 may regulate the amount of time that first switching element 120 is turned on. For instance, control circuit 140 may turn first switching element 120 on at a first time and turn first switching element 120 off at a second time.

Control circuit 140 may control the amount of time separating the first time and the second time. Control circuit 140 may deliver precise signals to the control terminal of first switching element 120, accurately controlling the amount of time that first switching element 120 is turned on. Source/sink unit 110 may provide power to control circuit 140.

Furthermore, in one example, control circuit 140 may regulate the amount of time that the second switching element (not pictured in FIG. 1) of snubber circuit 130 is turned on.

Load 160 may define a collection of electrical components that consume power. In some examples, load 160 may include brushless direct current (BLDC) electric motors, brushed direct current (DC) motors, alternating current (AC) induction motors, or other types of electric motors. Furthermore, load 160 may include a collection of circuit components such as resistors, inductors, capacitors, diodes such as light emitting diodes (LEDs), and other semiconductor elements. In some examples, load 160 may require a large current from source/sink unit 110. In one example, the maximum current required by load 160 may be greater than approximately 1000 Amperes. In one example, the maximum current drawn from source/sink unit 110 by load 160 may be greater than a peak value of the positive current drawn from source/sink unit 110 by first switching unit 120, and the maximum current drawn from source/sink unit 110 by load 160 may be greater than a peak value of the negative current delivered to source/sink unit 110 by snubber circuit 130.

Circuit 180 may include first switching element 120, snubber circuit 130, and control circuit 140. In one example, circuit 180 may be implemented on a printed circuit board (PCB). Circuit 180 may include any one or more of a microprocessor, a controller, a DSP, an ASIC, an FPGA, discrete logic circuitry, or any other processing circuitry configured to provide the functions attributed to circuit 180 herein. Circuit 180 may be embodied as firmware, hardware, software or any combination thereof.

Figure 2:
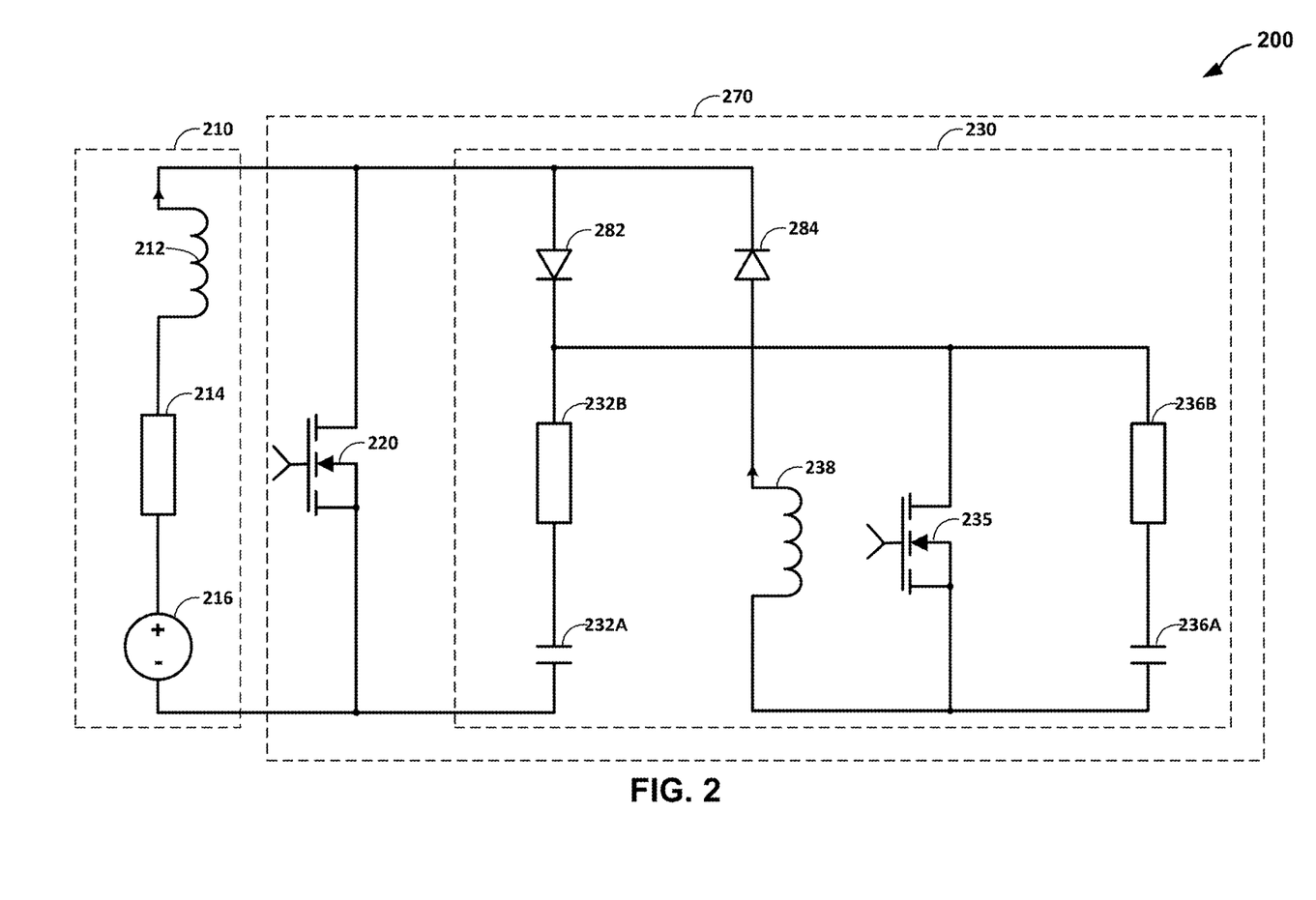
FIG. 2 is a block diagram of a system including a source/sink unit charge/discharge circuit, in accordance with one embodiment.

FIG. 2 is a block diagram of a source/sink unit charge/discharge system 200 including source/sink unit charge/discharge circuit 270, in accordance with one embodiment. As illustrated, a source/sink unit charge/discharge system 200 includes source/sink unit 210, a source/sink unit internal inductance 212, a source/sink unit internal resistance 214, source/sink unit voltage 216, first switching element 220, snubber circuit 230, first snubber unit 232, second switching element 235, second snubber unit 236, inductor 238, source/sink unit charge/discharge circuit 270, first diode 282, and second diode 284. Source/sink unit 210 may be an example of source/sink unit 110 of FIG. 1. First switching element 220 may be an example of first switching element 120 of FIG. 1. Snubber circuit 230 may be an example of snubber circuit 130 of FIG. 1. Source/sink unit charge/discharge circuit 270 may be an example of source/sink unit charge/discharge circuit 170 of FIG. 1.

Source/sink unit 210 may include a plurality of Lithium-Ion cells arranged in series. In other examples, source/sink unit 110 may include lead-acid, nickel metal hydride, or other types of materials. Source/sink unit 210 may define a first terminal and a second terminal. A current flowing from the first terminal to the second terminal of source/sink unit 210 may comprise a positive current, and a current flowing from the second terminal to the first terminal may comprise a negative current.

Source/sink unit 210 may define internal inductance 212, which may represent a parasitic inductance of source/sink unit 210. Inductors are electrical circuit components that resist change in the amount of current passing through the inductor. In some examples, inductors include an electrically conductive wire wrapped in a coil. As current passes through the coil, a magnetic field is created in the coil, and the magnetic field induces a voltage across the inductor. An inductor defines an inductance value, and the inductance value is the ratio of the voltage across the inductor to the rate of change of current passing through the inductor. Although inductors are distinct and identifiable electrical circuit components, other electrical circuit components that are not inductors may behave like inductors. For example, capacitors, resistors, batteries, semiconductor elements, and other types of electrical circuit components may define an inductance value, even though inductance may not be an intended property of these components.

In one example, internal inductance 212 does not comprise a physical circuit component. Rather, internal inductance 212 may comprise a parasitic and inherent property of source/sink unit 210 inseparable from the structure of source/sink unit 210. Internal inductance 212 may correspond to a first inductance value, and in one example, the first inductance value is greater than approximately 1 microhenry and less than approximately 50 microhenries. Internal inductance 212 may resist a change in current flowing from source/sink unit 210. Therefore, if a current-drawing circuit connected to source/sink unit 210 is broken, internal inductance 212 will remain charged for a period of time after the current-drawing circuit is broken, emitting an excess positive current.

For example, first switching element 220 may turn on, and in response to first switching element 220 becoming conductive, a positive current may flow from the first terminal of source/sink unit 210 to the second terminal of source/sink unit 210 via first switching element 220. Subsequently, after a period of time, first switching element 220 may turn off, and the circuit connecting the first terminal and the second terminal of source/sink unit 110 may be broken. However, an excess positive continues to dissipate from source/sink unit 110 for a period of time after first switching element 220 is turned off since internal inductance 212 resists change in current passing through source/sink unit 110.

Source/sink unit 210 may also define internal resistance 214. Like internal inductance 212, internal resistance 214 does not comprise an independent component. Rather, internal resistance 214 may comprise an inherent and parasitic property of source/sink unit 210 that is inseparable from the structure of source/sink unit 210. Internal resistance 214, like a conventional resistor, may resist current flowing across internal resistance 214.

Source/sink unit 210 may also define source/sink unit voltage 216. Voltage, defined as the difference in electric potential between two points, may drive current through a circuit. In the example illustrated in FIG. 1, source/sink unit voltage 216 comprises the difference in electric potential between the first terminal and the second terminal of source/sink unit 210. In one example, source/sink unit voltage 216 may comprise a voltage value 400 Volts.

First switching element 220 may be an example of first switching element 120 of FIG. 1. When first switching element 220 is turned on, first switching element may complete a circuit between the first terminal of source/sink unit 110 and the second terminal of source/sink unit 110. In one example, a positive current may flow through first switching element 220 and source/sink unit 210.

In the field of circuit electronics, a snubber circuit (also called a "snubber") may comprise a device including circuit components configured to suppress a voltage spike across a circuit element. A common example of a snubber is an RC snubber, which includes a resistor and a capacitor arranged in series. In some cases, an RC snubber is arranged parallel with a semiconductor switch. In the case of a rapid increase in voltage across the semiconductor switch, an RC snubber may be configured to draw current away from the semiconductor switch, thus limiting magnitude of the rapid increase in voltage across the semiconductor switch. RC snubbers may be configured to operate with either AC current or DC current. In another example, a snubber may comprise a diode snubber. Diode snubbers may be configured to operate with DC current, and diode snubbers may be placed parallel to an inductor. In the example illustrated in FIG. 2, first snubber unit 232 and second snubber unit 236 are RC snubbers.

Snubber circuit 230 may comprise one example of snubber circuit 130 of FIG. 1. Snubber circuit 230 may include circuit elements including resistors, capacitors, inductors, diodes, semiconductor switches, and other semiconductor elements. In the example illustrated in FIG. 2, snubber circuit 230 includes first snubber unit 232, second snubber unit 236, second switching element 235, inductor 238, first diode 282, and second diode 284.

In the example of FIG. 2, First snubber unit 232 may include first capacitor 232A defining capacitor internal resistance 232B. Although capacitor internal resistance 232B is illustrated in FIG. 2 as an element in series with first capacitor 232A, capacitor internal resistance 232B is a property inherent to first capacitor 232A itself. Much like internal resistance 214 of source/sink unit 210, capacitor internal resistance 232B is inseparable from first capacitor 232A, which is a physical component of snubber circuit 230. In other examples (not shown in FIG. 2), capacitor internal resistance 232B may be supplemented with a conventional resistor separate from first capacitor 232A. In one example, snubber unit 232 is parallel to first switching element 220.

In one example, first capacitor 232A is configured to absorb at least some of the excess positive current emitted by internal inductance 212 of source/sink unit 210 after first switching element 220 is turned off. The excess positive current may charge first capacitor 232A.

Second switching element 235 may comprise a power switch such as, but not limited to, any type of FET including a MOSFET, a BJT, an IGBT, a JFET, or another element that uses voltage for its control. Second switching element 235 may include an n-type transistor, a p-type transistor, and a power transistor, or any combination thereof. In some examples, second switching element 235 may include vertical transistors, lateral transistors, and/or horizontal transistors. In some examples, second switching element 235 may include other analog devices such as diodes and/or thyristors. In some examples, the second switching element 235 may operate as a switch and/or as an analog device.

Second switching element 235 may include three terminals: two load terminals and a control terminal. For MOSFET switches, second switching element 235 may include a drain terminal, a source terminal, and at least one gate terminal, where the control terminal is a gate terminal. For BJT switches, the control terminal may include a base terminal. Current may flow between the two load terminals of second switching element 235, based on the voltage at the control terminal. Therefore, electrical current may flow across second switching element 235 based on control signals delivered to the control terminal of second switching element 235. In one example, a voltage value of 10V must be applied to the control terminal of second switching element 235 in order to turn second switching element 235 'on,' allowing second switching element 235 conduct electricity. In other examples, other voltage values may be required to turn second switching element 235 on. Furthermore, second switching element 235 may be turned 'off' when the voltage applied to the control terminal of second switching element 235 is decreased. The resistance of second switching element 235 and the voltage across second switching element 235 are increased when second switching element 235 is turned off. In one example, second switching element 235 may be damaged if the voltage across the two load terminals of second switching element 235 exceeds a voltage threshold.

Second switching element 235 may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, silicon carbide switches may experience lower switching power losses. Improvements in magnetics and faster switching, such as Gallium Nitride switches, may support higher frequency converters. These higher frequency circuits may require control signals to be sent with more precise timing, as compared to lower-frequency circuits.

When second switching element 235 is turned on, first capacitor 232A may discharge and deliver a negative current to source/sink unit 210 via second switching element 235. The negative current may travel in the opposite direction as the positive current emitted by source/sink unit 210, and the negative current may recharge source/sink unit 210. After a period of time, second switching element 235 may be turned off. Subsequently, first capacitor 232A may continue to emit an excess negative current.

Second snubbing unit 236 may include second capacitor 236A and resistor 236B. Second capacitor 236A may absorb at least some of the excess negative current emitted by first capacitor 232A after second switching element 235 turns off. Furthermore, second capacitor 236A may absorb at least some of the excess positive current emitted by internal inductance 212 after first switching element 220 turns off. Resistor 236B and second capacitor 236A may be configured to absorb a large portion of the excess negative current, thus limiting the magnitude of the rapid increase in voltage across second switching element 235 after second switching element 235 turns off. In one example, resistor 236B may have a resistance value of greater than approximately 20 Ohms and less than approximately 30 Ohms. After second switching element 235 turns on, second capacitor 236A may discharge through second switching element 235. However, resistor 236B may limit the amount of current discharged through second switching element 235 from second capacitor 236A. In other words, resistor 236B may be configured to decrease a magnitude of a maximum current emitted by second snubbing unit 236 after second switching element 235 turns on.

First capacitor 232A may define a first capacitance value, and second capacitor 236A may define a second capacitance value. In one example, the first capacitance value may be greater than the second capacitance value. Additionally, in one example, the first capacitance value may be greater than approximately 10 microfarads, and less than approximately 500 microfarads. Furthermore, the second capacitance value may be greater than approximately 100 nanofarads, and less than approximately 900 nanofarads.

In the example illustrated in FIG. 2, inductor 238 is in series with second switching element 235 and second snubber unit 236. After second switching element 235 is turned on, first capacitor 232A may discharge, simultaneously emitting a negative current which may flow to source/sink unit 210 via second switching element 235 and inductor 238. Inductor 238 may limit a peak value of the negative current delivered to source/sink unit 210, and inductor 238 may limit a peak value of the negative current adjacent to second switching element 235. Consequently, inductor 238 may also limit a peak value of the voltage across second switching element 235 after second switching element 235 turns off.

Internal inductance 212 of source/sink unit 210 may include a first inductance value and inductor 238 may include a second inductance value. In one example, the first inductance value may be approximately equivalent to the second inductance value.

In one example, the positive current induced in source/sink unit 210 by first switching element 220 is larger than the negative current delivered to source/sink unit 210 by snubber circuit 230. Inductor 238 may decrease the maximum amplitude of the negative current delivered to the source/sink unit via second switching element 235. In one example, a peak value of the positive current drawn by first switching element 220 is greater than approximately 120 Amperes and less than approximately 150 Amperes, and a peak value of the negative current delivered by snubber circuit 230 is greater than approximately 10 Amperes and less than approximately 20 Amperes. In other examples, the peak value of the positive current and the peak value of the negative current are other values.

In the field of circuit electronics, diodes comprise semiconductor components which allow current to flow across the diode in a first direction (e.g., "forward direction") and prevent current from flowing across the diode in a second direction (e.g., "reverse direction"). A diode may include an anode and a cathode, and current may be able to pass through the diode in the forward direction from the anode to the cathode. However, current may be unable to pass through the diode in the reverse direction from the cathode to the anode.

First diode 282 may comprise a semiconductor diode, placed with an anode of first diode 282 adjacent to source/sink unit 210 and first switching element 220, and a cathode of first diode 282 adjacent to first snubber unit 232. In one example, first diode 282 may be configured to prevent first capacitor 232A from discharging and releasing a current through first switching element 220 after first switching element 220 is turned on, since current released by first capacitor 232A is unable to traverse first diode 282 through the reverse direction.

Second diode 284 may comprise a semiconductor diode placed in series with inductor 238, wherein an anode of second diode 284 is adjacent to inductor 238 and a cathode of second diode 284 is adjacent to source/sink unit 210 and first switching element 220. In one example, a control circuit (not pictured in FIG. 2), may control first switching element 220 and second switching element 235 such that first switching element 220 and second switching element 235 are never activated at the same time. However, in some cases, an error event may occur wherein switching elements 220 and 235 are turned on at the same time. In an example in which the error event occurs, second diode 284 may prevent first capacitor 232A from charging. In other examples, such as the example illustrated in FIG. 3, second diode 284 is not included in the snubber circuit.

In one example, first capacitor 232A may discharge while second switching element 235 is off. In this instance, capacitor 232A is configured to emit a negative current which may pass through resistor 236B, second capacitor 236A, inductor 238, and second diode 284A. Subsequently, the negative current may arrive at the first terminal of source/sink unit 210. Current resulting from a complete discharge of first capacitor 232A may be able to pass through second snubber unit 236 while second switching unit 235 is off, thus preventing a maximum voltage across second switching unit 235 from exceeding the voltage threshold in which second switching unit 235 is adversely affected.

Figure 3:
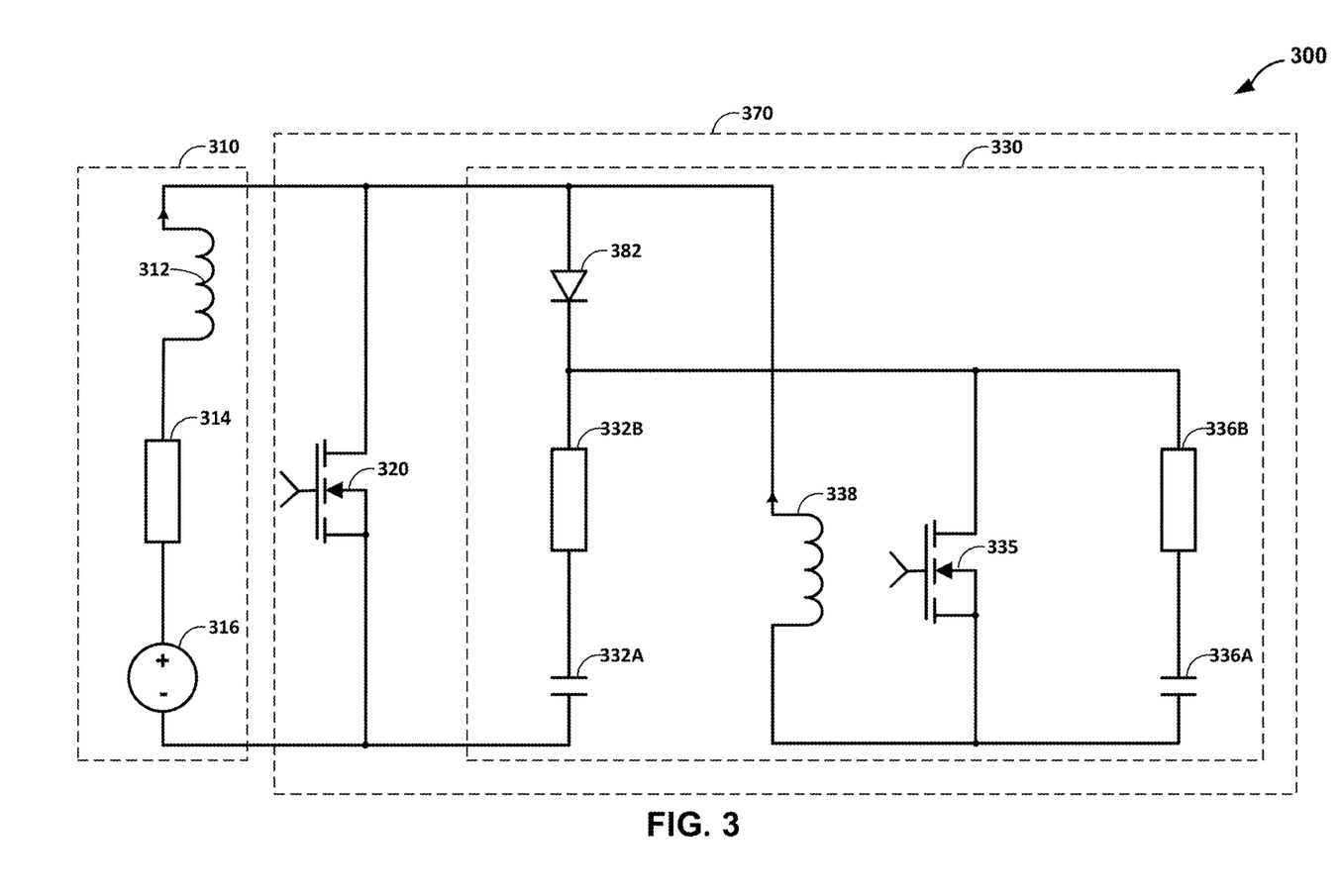
FIG. 3 is a block diagram of a source/sink unit charge/discharge system including a source/sink unit charge/discharge circuit, in accordance with another embodiment.

FIG. 3 is a block diagram of a source/sink unit charge/discharge system 300 including a source/sink unit charge/discharge circuit 370, in accordance with one embodiment. As illustrated, a source/sink unit charge/discharge system 300 includes a source/sink unit 310, a source/sink unit internal inductance 312, a source/sink unit internal resistance 314, a source/sink unit voltage 316, first switching element 320, snubber circuit 330, first snubber unit 332, second switching element 335, second snubber unit 336, inductor 338, a source/sink unit charge/discharge circuit 370, and diode 382. A source/sink unit 310 may be an example of Source/sink unit 210 of FIG. 2. A source/sink unit internal inductance 312 may be an example of a source/sink unit internal inductance 212 of FIG. 2. A source/sink unit internal resistance 314 may be an example of a source/sink unit internal resistance 214 of FIG. 2. A source/sink unit voltage 316 may be an example of source/sink unit voltage 216 of FIG. 2. First switching element 320 may be an example of first switching element 220 of FIG. 2. Snubber circuit 330 may be an example of snubber circuit 230 of FIG. 2. First snubber unit 332 may be an example of first snubber unit 232 of FIG. 2. Second switching element 335 may be an example of second switching element 235 of FIG. 2. Second snubber unit 336 may be an example of second snubber unit 236 of FIG. 2. Inductor 338 may be an example of inductor 238 of FIG. 2. A source/sink unit charge/discharge circuit 370 may be an example of source/sink unit charge/discharge circuit 270 of FIG. 2. Diode 382 may be an example of first diode 282 of FIG. 2.

A source/sink unit charge/discharge system 300 may be substantially similar to a source/sink unit charge/discharge system 200 of FIG. 2 except that a second diode placed in series with inductor 238 of FIG. 2. is not present in the example of FIG. 3. For instance, the negative current released by second capacitor 332A after second switching element 335 is turned on may flow directly to a source/sink unit 310 through second switching element 335 and inductor 338, without passing through a diode. A control circuit (not pictured in FIG. 3) may accurately control first switching element 320 and second switching element 335 such that first switching element 320 and second switching element 335 are never activated at the same time. In this case, a diode is not necessary in series with inductor 238.

Figure 4:
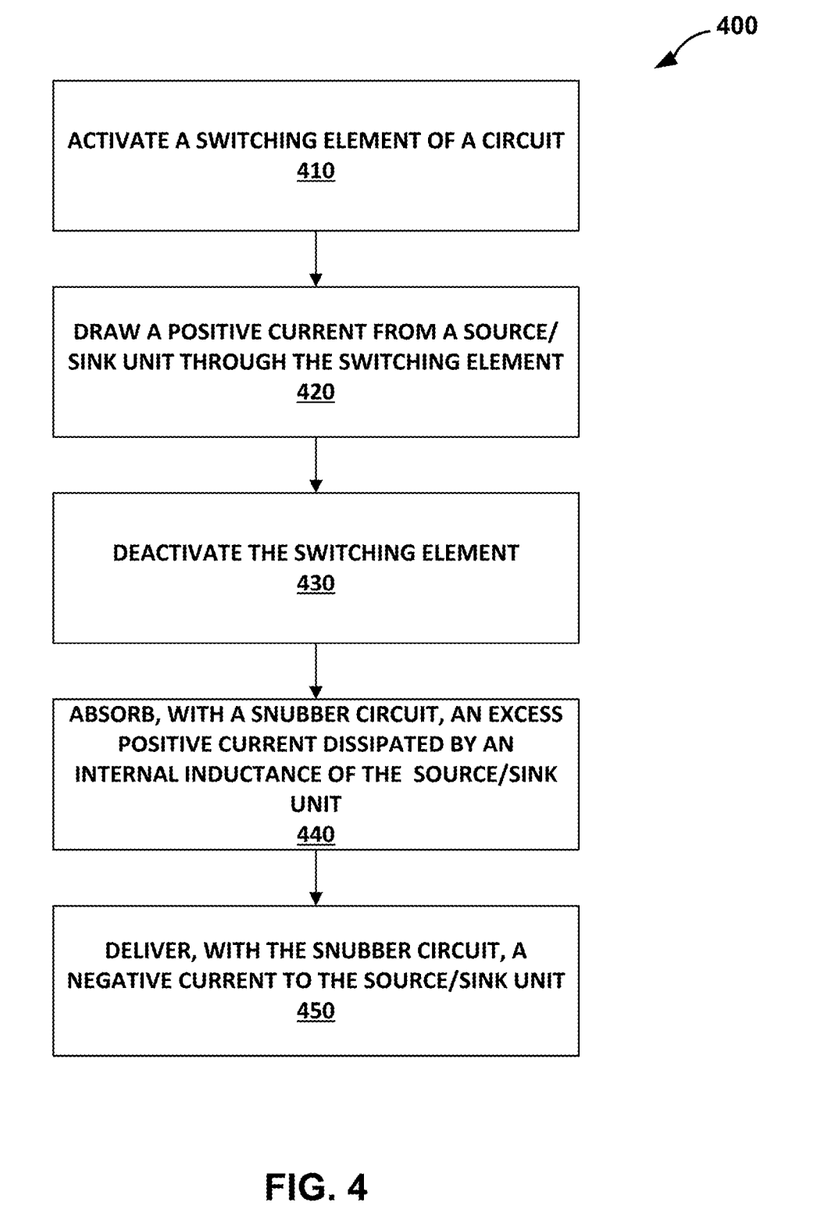
FIG. 4 is a first flow diagram consistent with techniques that may be performed by the circuit of FIG. 1, in accordance with this disclosure.

FIG. 4 is a first flow diagram 400 consistent with techniques that may be performed by the circuit of FIG. 1, in accordance with this disclosure. For purposes of illustration only, FIG. 4 is described below within the context of system 100 of FIG. 1. However, the techniques described below can be used in any permutation, and in any combination, with source/sink unit 110, first switching element 120, snubber circuit 130, and control circuit 140.

In accordance with one or more techniques of this disclosure, control circuit 140 may activate first switching element 120 (410). First switching element 120, which may conduct electricity after it is activated, may draw a positive current from source/sink unit 110 through first switching element 120 (420). Subsequently, control circuit 140 may deactivate first switching element 120 (430) and snubber circuit 130 may absorb an excess positive current dissipated by an internal inductance of source/sink unit 110 (440). Snubber circuit 130 may deliver a negative current to source/sink unit 110 (450).

In one example, flow diagram 400 represents a single switching cycle of source/sink unit charge/discharge circuit 170 illustrated in FIG. 1. Charge/discharge circuit 170 may perform a plurality of switching cycles, and control circuit 140 may be configured to regulate the number of switching cycles performed and regulate the length of each individual switching cycle. In one example, the length of each switching cycle of the plurality of switching cycles is greater than approximately 40 microseconds and less than approximately 50 microseconds. However, in other examples, the length of each switching cycle of the plurality of switching cycles may comprise other values. In one example, control circuit 140 may increase the length of each switching cycle.

The following examples may illustrate one or more aspects of the disclosure.

Example 1

A circuit includes a switching element configured to draw a positive current from a source/sink unit when the switching element is turned on, the source/sink unit including an inductance, the inductance emitting an excess positive current after the switching element is turned off. The circuit further includes a snubber circuit configured to absorb the excess positive current from the inductance of the source/sink unit, and deliver a negative current to the source/sink unit, wherein the delivered negative current has a lower amperage and a longer duration than the positive current.

Example 2

The circuit of example 1, wherein the switching element includes a metal-oxide-semiconductor field-effect transistor (MOSFET), a bipolar junction transistor (BJT), an insulated gate bipolar transistor (IGBT), or a junction field effect transistor (JFET), wherein the switching element is configured to conduct current while the first switching element is turned on.

Example 3

The circuit of examples 1-2 or any combination thereof, wherein the switching element includes a first switching element, wherein the snubber circuit includes a snubber unit parallel to the first switching element, wherein the snubber unit includes a capacitor, and wherein the capacitor is configured to absorb at least some of the excess positive current. The snubber circuit further includes a second switching element configured to discharge the capacitor after the second switching element is turned on, wherein the capacitor is configured to emit a negative current.

Example 4

The circuit of examples 1-3 or any combination thereof, wherein the snubber unit includes a first snubber unit, wherein the capacitor includes a first capacitor, and wherein the snubber circuit further includes a second snubber unit parallel to the second switching element. The second snubber unit includes a second capacitor, wherein the second capacitor is configured to absorb at least some of the excess positive current, and a resistor in series with the second capacitor, wherein at least some of the negative current emitted by the first capacitor is delivered to the source/sink unit via the second switching element, and wherein, after the second switching element is turned off, the second capacitor is configured to absorb an excess negative current emitted by the first capacitor.

Example 5

The circuit of examples 1-4 or any combination thereof, wherein the second capacitor is configured to discharge through the second switching element after the second switching element is turned on.

Example 6

The circuit of examples 1-5 or any combination thereof, wherein the snubber circuit further includes an inductor in series with the second switching element and the second snubber unit, wherein the negative current is delivered to the source/sink unit via the inductor during the discharge of the first capacitor.

Example 7

The circuit of examples 1-6 or any combination thereof, further including a diode configured to prevent the first capacitor from discharging through the first switching element after the first switching element is turned on.

Example 8

The circuit of examples 1-7 or any combination thereof, wherein the diode includes a first diode, wherein the circuit further includes a second diode placed in series with the inductor, and wherein an anode of the second diode is adjacent to the inductor.

Example 9

The circuit of examples 1-8 or any combination thereof, wherein the first capacitor defines a first capacitance value, wherein the second capacitor defines a second capacitance value, and wherein the first capacitance value is greater than the second capacitance value.

Example 10

The circuit of examples 1-9 or any combination thereof, wherein the first capacitance value is greater than approximately 10 microfarads, and less than approximately 500 microfarads.

Example 11

The circuit of examples 1-10 or any combination thereof, wherein the second capacitance value is greater than approximately 100 nanofarads, and less than approximately 900 nanofarads.

Example 12

The circuit of examples 1-11 or any combination thereof, wherein the inductor defines a first inductance value, wherein the inductance of the source/sink unit defines a second inductance value, and wherein the first inductance value is approximately equal to the second inductance value.

Example 13

The circuit of examples 1-12 or any combination thereof, wherein the first inductance value and the second inductance value are greater than approximately 1 microhenry and less than approximately 50 microhenries.

Example 14

A system includes a source/sink unit including an inductance, a control circuit, and a charge/discharge unit. The charge/discharge unit includes a switching element configured to draw a positive current from the source/sink unit when the switching element is turned on, the inductance of the source/sink unit emitting an excess positive current after the switching element is turned off, and a snubber circuit configured to absorb the excess positive current from the inductance of the source/sink unit, and deliver a negative current to the source/sink unit, wherein the delivered negative current has a lower amperage and a longer duration than the positive current, and wherein the control circuit is configured to send control signals to the switching element, the control signals turning on the switching element and turning off the switching element.

Example 15

The system of example 14, wherein the switching element includes a first switching element, and wherein the snubber circuit includes a snubber unit parallel to the first switching element, wherein the snubber unit includes a capacitor, and wherein the capacitor is configured to absorb at least some of the excess positive current. The snubber circuit further includes a second switching element configured to discharge the capacitor after the second switching element is turned on, wherein the capacitor is configured to emit a negative current, and wherein the control circuit is configured to send control signals to the second switching element, the control signals turning on the second switching element and turning off the second switching element.

Example 16

The system of examples 14-15 or any combination thereof, wherein the snubber unit includes a first snubber unit, wherein the capacitor includes a first capacitor, and wherein the snubber circuit further includes a second snubber unit parallel to the second switching element, wherein the second snubber unit includes a second capacitor, wherein the second capacitor is configured to absorb at least some of the excess positive current, and a resistor in series with the second capacitor, wherein at least some of the negative current emitted by the first capacitor is delivered to the source/sink unit via the second switching element, and wherein, after the second switching element is turned off, the second capacitor is configured to absorb an excess negative current emitted by the first capacitor.

Example 17

A method includes drawing a positive current by a first switching element configured from a source/sink unit when the first switching element is turned on, the source/sink unit including an inductance, the inductance emitting an excess positive current after the first switching element is turned off absorbing the excess positive current from the inductance of the source/sink unit, and delivering a negative current to the source/sink unit, wherein the negative current has a lower amperage and a longer duration than the positive current.

Example 18

The method of claim 17, wherein absorbing the excess positive current includes absorbing, with a first snubber unit parallel to the first switching element, at least some of the excess positive current, wherein the first snubber unit includes a first capacitor, and wherein delivering the negative current includes discharging the first capacitor after the second switching element is turned on, wherein the first capacitor is configured to emit the negative current.

Example 19

The method of examples 17-18 or any combination thereof, wherein absorbing the excess positive current further includes absorbing, with a second capacitor, at least some of the excess positive current, wherein delivering the negative current further includes delivering at least some of the negative current emitted by the first capacitor to the source/sink unit via a second switching element, and wherein the method further includes absorbing, by the second capacitor, an excess negative current emitted by the first capacitor after the second switching element is turned off.

Example 20

The method of examples 17-19 or any combination thereof, further including discharging the second capacitor through the second switching element after the second switching element is turned on.

Various examples of the disclosure have been described. Any combination of the described systems, operations, or functions is contemplated. These and other examples are within the scope of the following claims.

What is claimed is:

1. A circuit comprising:
   a switching element configured to draw a positive current from a source/sink unit when the switching element is turned on, the source/sink unit comprising an inductance, the inductance emitting an excess positive current after the switching element is turned off; and
   a snubber circuit configured to:
     absorb the excess positive current from the inductance of the source/sink unit, and
     deliver a negative current to the source/sink unit, wherein the negative current travels in an opposite direction of the positive current relative to the source/sink unit, and wherein the delivered negative current has a lower amperage and a longer duration than the positive current.

2. The circuit of claim 1, wherein the switching element comprises a metal-oxide-semiconductor field-effect transistor (MOSFET), a bipolar junction transistor (BJT), an insulated gate bipolar transistor (IGBT), or a junction field effect transistor (JFET), wherein the switching element is configured to conduct current while the switching element is turned on.

3. The circuit of claim 1, wherein the switching element comprises a first switching element, and wherein the snubber circuit comprises:
a snubber unit parallel to the first switching element, wherein the snubber unit comprises a capacitor, and wherein the capacitor is configured to absorb at least some of the excess positive current; and
a second switching element configured to discharge the capacitor after the second switching element is turned on, wherein the capacitor is configured to emit a negative current.

4. The circuit of claim 3, wherein the snubber unit comprises a first snubber unit, wherein the capacitor comprises a first capacitor, and wherein the snubber circuit further comprises:
a second snubber unit parallel to the second switching element, wherein the second snubber unit comprises:
a second capacitor, wherein the second capacitor is configured to absorb at least some of the excess positive current, and
a resistor in series with the second capacitor,
wherein at least some of the negative current emitted by the first capacitor is delivered to the source/sink unit via the second switching element, and
wherein, after the second switching element is turned off, the second capacitor is configured to absorb an excess negative current emitted by the first capacitor.

5. The circuit of claim 4, wherein the second capacitor is configured to discharge through the second switching element after the second switching element is turned on.

6. The circuit of claim 4, wherein the snubber circuit further comprises an inductor in series with the second switching element and the second snubber unit, wherein the negative current is delivered to the source/sink unit via the inductor during the discharge of the first capacitor.

7. The circuit of claim 6, wherein the inductor defines a first inductance value, wherein the inductance of the source/sink unit defines a second inductance value, and wherein the first inductance value is approximately equal to the second inductance value.

8. The circuit of claim 7, wherein the first inductance value and the second inductance value are greater than approximately 1 microhenry and less than approximately 50 microhenries.

9. The circuit of claim 4, further comprising a diode configured to prevent the first capacitor from discharging through the first switching element after the first switching element is turned on.

10. The circuit of claim 9, wherein the diode comprises a first diode, wherein the circuit further comprises a second diode placed in series with the inductor, and wherein an anode of the second diode is adjacent to the inductor.

11. The circuit of claim 4, wherein the first capacitor defines a first capacitance value, wherein the second capacitor defines a second capacitance value, and wherein the first capacitance value is greater than the second capacitance value.

12. The circuit of claim 11, wherein the first capacitance value is greater than approximately 10 microfarads, and less than approximately 500 microfarads.

13. The circuit of claim 11, wherein the second capacitance value is greater than approximately 100 nanofarads, and less than approximately 900 nanofarads.

14. A system comprising:
a source/sink unit comprising an inductance;
a control circuit; and
a charge/discharge unit comprising:
a switching element configured to draw a positive current from the source/sink unit when the switching element is turned on, the inductance of the source/sink unit emitting an excess positive current after the switching element is turned off; and
a snubber circuit configured to:
absorb the excess positive current from the inductance of the source/sink unit, and
deliver a negative current to the source/sink unit, wherein the negative current travels in an opposite direction of the positive current relative to the source/sink unit,
wherein the delivered negative current has a lower amperage and a longer duration than the positive current, and
wherein the control circuit is configured to send control signals to the switching element, the control signals turning on the switching element and turning off the switching element.

15. The system of claim 14, wherein the switching element comprises a first switching element, and wherein the snubber circuit comprises:
a snubber unit parallel to the first switching element, wherein the snubber unit comprises a capacitor, and wherein the capacitor is configured to absorb at least some of the excess positive current; and
a second switching element configured to discharge the capacitor after the second switching element is turned on,
wherein the capacitor is configured to emit a negative current, and
wherein the control circuit is configured to send control signals to the second switching element, the control signals turning on the second switching element and turning off the second switching element.

16. The system of claim 15, wherein the snubber unit comprises a first snubber unit, wherein the capacitor comprises a first capacitor, and wherein the snubber circuit further comprises:
a second snubber unit parallel to the second switching element, wherein the second snubber unit comprises:
a second capacitor, wherein the second capacitor is configured to absorb at least some of the excess positive current, and
a resistor in series with the second capacitor,
wherein at least some of the negative current emitted by the first capacitor is delivered to the source/sink unit via the second switching element, and
wherein, after the second switching element is turned off, the second capacitor is configured to absorb an excess negative current emitted by the first capacitor.

17. The method of claim 14, wherein absorbing the excess positive current comprises absorbing, with a first snubber unit parallel to the first switching element, at least some of the excess positive current, wherein the first snubber unit comprises a first capacitor, and wherein delivering the negative current comprises discharging the first capacitor after the second switching element is turned on, wherein the first capacitor is configured to emit the negative current.

18. The method of claim 15, wherein absorbing the excess positive current further comprises absorbing, with a second capacitor, at least some of the excess positive current,
   wherein delivering the negative current further comprises delivering at least some of the negative current emitted by the first capacitor to the source/sink unit via a second switching element, and
   wherein the method further comprises absorbing, by the second capacitor, an excess negative current emitted by the first capacitor after the second switching element is turned off.

19. The method of claim 16 further comprising discharging the second capacitor through the second switching element after the second switching element is turned on.

20. A method comprising:

drawing a positive current by a first switching element configured from a source/sink unit when the first switching element is turned on, the source/sink unit comprising an inductance, the inductance emitting an excess positive current after the first switching element is turned off;

absorbing the excess positive current from the inductance of the source/sink unit; and delivering a negative current to the source/sink unit, wherein the negative current travels in an opposite direction of the positive current relative to the source/sink unit, and wherein the negative current has a lower amperage and a longer duration than the positive current.

* * * * *